US008850103B2

(12) United States Patent
Bennett

(10) Patent No.: US 8,850,103 B2
(45) Date of Patent: Sep. 30, 2014

(54) INTERRUPTIBLE NAND FLASH MEMORY

(75) Inventor: John G. Bennett, Bellevue, WA (US)

(73) Assignee: Microsoft Corporation, Redmond, WA (US)

(*) Notice: Subject to any disclaimer, the term of this patent is extended or adjusted under 35 U.S.C. 154(b) by 305 days.

(21) Appl. No.: 12/549,897

(22) Filed: Aug. 28, 2009

(65) Prior Publication Data

US 2011/0055453 A1    Mar. 3, 2011

(51) Int. Cl.
| G06F 12/00 | (2006.01) |
| G06F 13/00 | (2006.01) |
| G06F 13/28 | (2006.01) |
| G11C 16/32 | (2006.01) |
| G11C 16/26 | (2006.01) |
| G11C 7/22  | (2006.01) |
| G11C 16/16 | (2006.01) |
| G11C 16/10 | (2006.01) |
| G11C 11/56 | (2006.01) |
| G11C 16/04 | (2006.01) |

(52) U.S. Cl.
CPC ............... *G11C 16/10* (2013.01); *G11C 16/32* (2013.01); *G11C 16/26* (2013.01); *G11C 7/22* (2013.01); *G11C 16/16* (2013.01); *G11C 16/0483* (2013.01); *G11C 2216/20* (2013.01); *G11C 11/5621* (2013.01)
USPC ........................... 711/103; 711/168; 711/151

(58) Field of Classification Search
None
See application file for complete search history.

(56) References Cited

U.S. PATENT DOCUMENTS

| 5,034,922 | A  | * | 7/1991  | Burgess ................. 365/189.07 |
| 5,509,134 | A  |   | 4/1996  | Fandrich |
| 5,559,988 | A  | * | 9/1996  | Durante et al. ............... 711/152 |
| 5,822,244 | A  |   | 10/1998 | Hansen et al. |
| 5,847,998 | A  |   | 12/1998 | Van Buskirk |
| 5,912,848 | A  |   | 6/1999  | Bothwell |
| 7,197,607 | B2 |   | 3/2007  | Roohparvar |
| 8,004,884 | B2 | * | 8/2011  | Franceschini et al. ........ 365/163 |
| 2005/0050283 | A1 | * | 3/2005 | Miller et al. .................. 711/150 |

(Continued)

FOREIGN PATENT DOCUMENTS

| CN | 1293778    | 5/2001 |
| CN | 101410905  | 4/2009 |
| JP | 07-181195 A | 6/1995 |

OTHER PUBLICATIONS

Inoue, A. et al., "NAND Flash Applications Design Guide", Apr. 2003, Toshiba, Revision 1.0, pp. 4-29.*

(Continued)

*Primary Examiner* — Reginald Bragdon
*Assistant Examiner* — Stella Eun
(74) *Attorney, Agent, or Firm* — Steve Wight; Peter Taylor; Micky Minhas

(57) ABSTRACT

A NAND flash memory logical unit. The NAND flash memory logical unit includes a control circuit that responds to commands and permits program and/or erase commands to be interruptible by read commands. The control circuit includes a set of internal registers for performing the current command, and a set of external registers for receiving commands. The control circuit also includes a set of supplemental registers that allow the NAND flash memory logical unit to have redundancy to properly hold state of an interrupted program or erase command. When the interrupted program or erase command is to resume, the NAND flash memory logical unit thus can quickly resume the paused program or erase operation. This provides significant improvement to read response times in the context of a NAND flash memory logical unit.

23 Claims, 5 Drawing Sheets

(56) References Cited

U.S. PATENT DOCUMENTS

2005/0157560 A1* 7/2005 Hosono et al. .......... 365/185.22
2007/0239926 A1 10/2007 Gyl et al.
2008/0250270 A1 10/2008 Bennett

OTHER PUBLICATIONS

Cooke, J., "The Inconvenient Truths of NAND Flash Memory", Aug. 2007, Micron Technology, pp. 1-32.*

Enhanced Flash Driver (EFD) http://www.numonyx.com/Documents/User%20Guides/319060_EFD_UsersGuide.pdf 78 pages, Nov. 2008.

Denali Releases ONFi 2.0 Memory Controller and Verification Suites http://www.design-reuse.com/news/18778/onfi-2-0-memory-controller.html 2 pages, Jul. 2008.

Author Unknown, "Simultaneous Read/Write Family" http://www.amd.com/us-en/0,,3_1447_1453,00.html, 2 pages, available at least as early as Apr. 13, 2009.

* cited by examiner

INTERRUPTIBLE NAND FLASH MEMORY

BACKGROUND

Flash memory is a solid state non-volatile memory that is erased in large sections, and is prevalent in many kinds of electronics. Flash memory is composed of memory cells that each include a floating gate transistor. The state of the memory cell is controlled by the amount of charge on the corresponding floating gate. Electrons may be added to (through programming) or removed from (through erasure) the floating gate in order to change the state of the memory cell. Traditionally, each memory cell contains a single bit of information by having only two distinctive states, each state corresponding to a distinct range of charge on the floating gate. Newer flash memory cells might each contain multiple bits of information by having more numerous distinctive states (e.g., four states for two bits of information).

There are two types of flash memory, NOR flash and NAND flash. Compared to NOR flash, NAND flash memory has shorter erase times and programs more data per second, and requires less space per memory cell. One conventional specification defining the organization of NAND flash memory as well as the communication protocol for communicating with NAND flash memory is referred to as the Open NAND Flash Interface (ONFI) standard.

According to the ONFI standard, NAND flash memory is organized into logical units. Each logical unit includes an array of memory cells and corresponding control circuitry for responding to commands to read from and write to portions of the memory array. The ONFI standard refers to these logical units as "Logical Unit Numbers" or "LUNs". According to the ONFI standard, each NAND flash memory LUN is organized into blocks, wherein each LUN contains multiple blocks. Furthermore, each block contains multiple pages, and each page contains multiple memory cells.

BRIEF SUMMARY

Embodiments described herein relate to a NAND flash memory logical unit and its operation. The NAND flash logical unit includes a control circuit that responds to commands and permits program and/or erase commands to be interruptible by read commands. The control circuit includes a set of internal registers that are directly usable memory cells for executing the currently active in-process command. The control circuit also includes a set of external registers for communication with an external command source. The control circuit also includes a set of supplemental registers that allow the NAND flash memory logical unit to properly hold state of an interrupted program or erase command while the higher priority interruption proceeds to use the normal working registers. When the interrupted program or erase command is to resume, the NAND flash memory logical unit can quickly resume the paused program or erase operation with the contents of the supplemental registers.

This provides significant improvement to read response times in the context of a NAND flash memory logical unit. Thus, even if an external command circuit previously provided program or erase commands to the control circuit, the control circuit may respond quickly to a subsequent read command from the external command source by placing the program operation or the erase operation on hold.

This Summary is not intended to identify key features or essential features of the claimed subject matter, nor is it intended to be used as an aid in determining the scope of the claimed subject matter.

BRIEF DESCRIPTION OF THE DRAWINGS

In order to describe the manner in which the above-recited and other advantages and features can be obtained, a more particular description of various embodiments will be rendered by reference to the appended drawings. Understanding that these drawings depict only sample embodiments and are not therefore to be considered to be limiting of the scope of the invention, the embodiments will be described and explained with additional specificity and detail through the use of the accompanying drawings in which.

DETAILED DESCRIPTION

In accordance with embodiments described herein, a NAND flash memory technology is described that permits for interruption of in-process non-read commands in order to more quickly fulfill read commands, thereby improving higher priority read times. First, the basic memory cells of a NAND flash memory will be described with respect to FIG. 1. Then, a NAND flash memory module is illustrated and described with respect to FIG. 2. A control circuit that controls a NAND memory logical unit is then illustrated and described with respect to FIG. 3. In conclusion, the principles of operation of the control circuit will be illustrated and described with respect to FIGS. 4 through 6.

Figure 1:
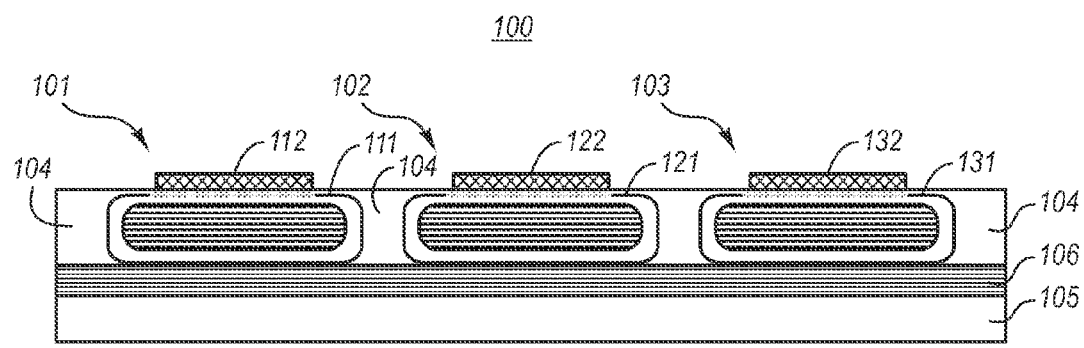
FIG. 1 illustrates a series of example NAND flash memory cells in accordance with the prior art.

FIG. 1 illustrates a cross-section of a series 100 of three NAND flash memory cells 101, 102 and 103. FIG. 1 illustrates prior art NAND flash memory cells, and is provided for reference only. The principles described herein may apply to any array of NAND flash memory cells, regardless of the structure or the design of the NAND flash memory cells. FIG. 1 is not drawn to scale, and includes only major structures, but is provided only for general description of the operation of a NAND flash memory cell. Although, for clarity, only three NAND memory cells are illustrated in FIG. 1, though many commercially-available NAND flash memory arrays include billions of memory cells.

Each NAND flash memory cell 101, 102 and 103 has a corresponding as conductive floating gate 111, 121 and 131, respectively. The floating gates 111, 121 and 131 may be made out of various conductive materials typically using polycrystalline or amorphous silicon. The gates are called "floating" because they are surrounded in all directions by a highly-efficient and pure insulator 104 such as Silicon Nitride or Silicon Dioxide. This insulator is sufficiently good that excess electrons that may be on the floating gate will on average take many years to leak across the insulator at normal voltage and temperature.

This floating gate is the memory part of the cell. The value stored by the memory cell is dependent upon the amount of charge (i.e., the number of electrons) on the corresponding floating gate. Traditionally, each memory cell only holds one bit of information by storing one of two possible states. In that case, the circuit is only able to discern two possible ranges of charge on the floating gate, each possible range resolving to one of the two possible values for the bit. However, more modern NAND flash memory cells are read by circuitry capable of discerning and programming more than two, perhaps four or more, possible states, thereby enabling each memory cell to store even more information, perhaps two bits or more for each memory cell.

The memory cells 101, 102 and 103 are implemented on an insulating or weakly semiconducting substrate 105. For instance, the substrate 105 might be Silicon crystal or Silicon on an insulator such as Silicon Dioxide. The circuit elements are implanted, etched into, or layered upon the substrate. A conductive channel 106 is created, by implanting or etching to add doping atoms. Each memory cell 101, 102 and 103 also has a control gate 112, 122 and 132, respectively made of a conductive material, commonly aluminum or amorphous silicon.

Current flowing through the conductive channel 106 is modulated by as charge on the nearby control gates and floating gates, forming the basis for detecting the state of the memory. In a NAND flash memory, several gates share the same channel, yielding increased circuit density. For instance, in FIG. 1, the memory cells 101, 102 and 103 each share the conductive channel 106. This increases the permissible density of memory cells, but also complicates the task of sensing the state of any one gate. This is because the signal is fainter and so must be amplified and sampled over time to separate the signal from noise.

The control gate serves two functions. First, the control gate can erase or program the corresponding floating gate. For instance, control gate 112 can erase or program the corresponding floating gate 111, the control gate 122 can erase or program the corresponding floating gate 121, and the control gate 132 can erase or program the corresponding floating gate 131. This works by setting a sufficient voltage on the control gate, such that the voltage differential between the control gate and the floating gate results in a strong enough electric field that causes electrons to tunnel across the insulator surrounding the floating gate. Although the insulator is nearly perfect, quantum tunneling of electrons across the very thin, nanometer-scaled layer of insulation between the control gate and the floating gate can still occur. If the voltage difference is large enough, then the floating gate may be erased (excess electrons removed from the floating gate) or programmed (excess electrons injected into the floating gate). Each electron individually makes the jump in a matter of femtoseconds once the jump starts, wherein movement of all of the electrons needed to erase or program is much longer (e.g., milliseconds accord to conventional erase and program technologies) because each electron will make the jump at a different time.

The other use of the control gate is to select which of the several memory cells is to be measured by sense circuitry attached to the shared conductive channel. The absence or presence of charge on the floating gate allows or inhibits the control gate's modulation of the current flow in the channel, thereby allowing the sense circuitry to detect a state of the corresponding memory cell.

Figure 2:
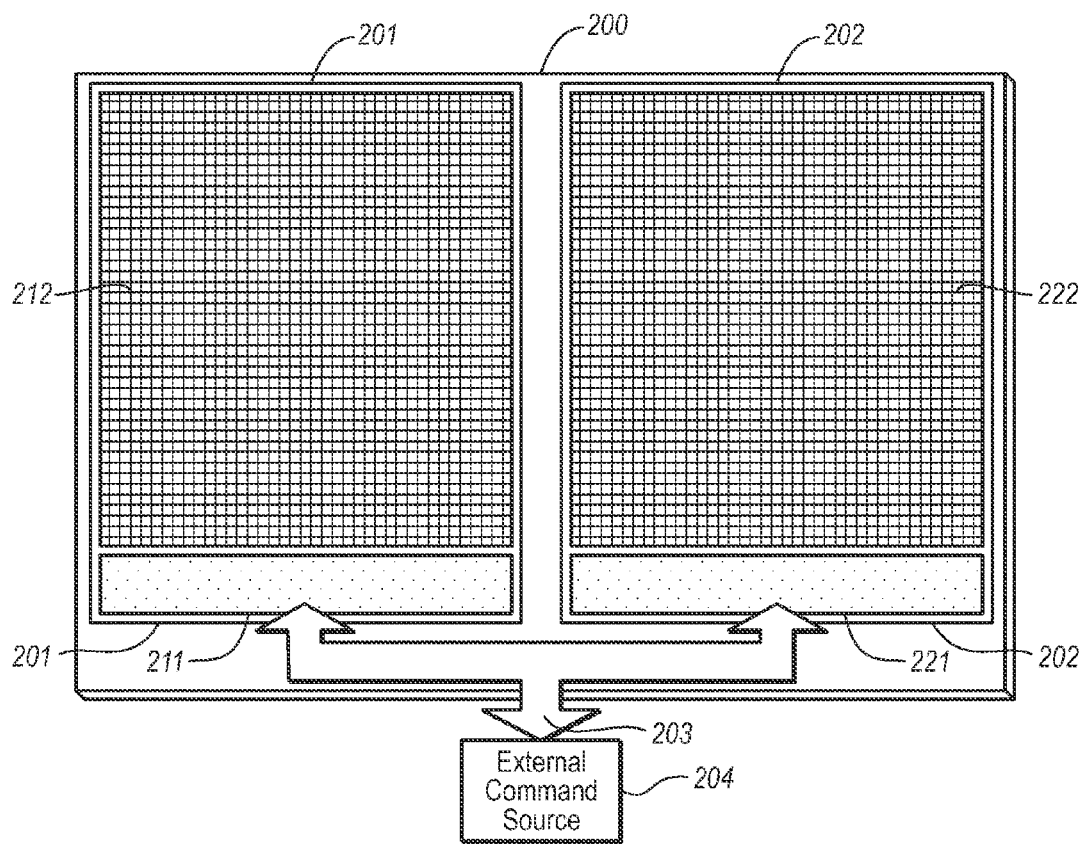
FIG. 2 illustrates a block diagram of a NAND flash memory module that contains two NAND flash memory logical units, wherein the NAND flash memory logical units contain control circuitry that is capable of interrupting an erase or program command with a read command.

FIG. 2 illustrates a block diagram of a NAND flash memory module 200. Although conventional NAND flash memory modules may be structured as illustrated in FIG. 2, the NAND flash memory module in accordance with the principles described herein may also be structured that way as well. However, the principles described herein provide significantly different control circuitry that allows read operations to interrupt non-read operations such as program and erase operations, thereby significantly reducing the average latency associated with the read operations.

The NAND flash memory module 200 of FIG. 2 includes two NAND flash memory logical units 201 and 202 that are communicatively coupled with an external command source 204 over a single communication bus interface 203. The nature of such external command source 204 is not important to the principles of the present invention, but the source 204 might be any device or system, whether conventional, or whether yet-to-be-developed, that might have use for communication with non-volatile memory such as NAND flash memory. The command source 204 is labeled as "external" only because it communicates through a communication bus interface 203 in order to communicate with the NAND flash memory module 200. The term "external" does not require that the command source 204 is necessarily on a different chip than the NAND flash memory module 200.

A bus that communicates with a NAND flash logical unit might communicate using the ONFI protocol, such as versions 1.0, 2.0, or 2.1 of that protocol, or subsequent versions of that protocol, or replacement protocols, or any other protocol for communication with a NAND flash memory. Hereinafter, ONFI protocol versions 1.0, 2.0, 2.1 and subsequent versions will be referred to collectively referred to in the claims as "an ONFI protocol". However, the principles described herein are not limited to any bus communication protocol. In the future, the principles described herein may be just as advantageous when applied to NAND flash memory communication protocols that have not even been developed yet at present.

Each NAND flash memory module may have any number of logical units. However, a NAND flash memory module might also contain just one logical unit, two logical units as in the case of FIG. 2, or more than two logical units. If a NAND flash memory chip uses multiple busses, then each bus and the corresponding logical unit that is connected to that bus may be considered a separate module. Thus, a single NAND flash memory chip may have multiple NAND flash memory modules (as many as there are separate busses). FIG. 2 illustrates just one NAND flash memory module 200 since there is just one bus 203. Although a NAND flash memory chip might include multiple NAND flash memory modules, the opposite might also be true. That is, a single NAND flash memory module may be composed of multiple chips. In addition, perhaps a NAND flash memory chip includes only one NAND flash memory module.

Each NAND flash memory logical unit 201 and 202 has a corresponding control circuit 211 and 221, respectively. Each control circuit response to commands that are targeted to a corresponding array of memory cells. For instance, control circuit 211 responds to commands to read, erase, or program memory cells of memory array 212. Control circuit 221 response to commands to read, erase, or program memory cells of memory array 222. Each memory array 212 and 222 is composed of as NAND memory cells, an example of which being the NAND memory cells 101, 102 and 103 of FIG. 1.

Each NAND flash memory logical unit 201 and 202 may include a queue (not shown) to hold commands that are not yet ready to be attended to. Alternatively or in addition, the queue may be implemented on the command source 204 that communicates with the NAND flash memory logical unit 200. A typical data storage system might have available multiple NAND flash memory modules to write data into, and read data from. Writing data to a NAND flash memory involves first erasing a portion of the memory array, one block of memory at a time according to ONFI, and then programming the memory array, typically one page at a time. Thus, in a write operation, a single erase operation of a block may be followed by multiple program operations to repopulate the block. That said, the principles described herein are not limited to the size of data that corresponds to a single erase, write, or read command. Erasing is important since the floating gates should begin the programming operation in approximately the same state with electrons substantially removed in order to gain predictability on the amount of charge that will accumulate on the floating gate as a result of the program operation. The erasure also ensures that memory cells that are not to be programmed have the appropriate state.

Erasure and programming are comparatively slow operations compared to a read operation. Also, in general purpose storage systems, the amount of read activity is generally much more than the amount of write activity. Therefore, in conventional designs, the system will generally be designed to buffer the data waiting to be written, and to confine the slow erase and program operations to a small subset of the logical units at any one time so as to minimize their interference with reads.

Unfortunately, interference will still occur at a significant rate which will damage system response times. Consider the situation when just one logical unit 201 is occupied by an erase or program operation. That slow operation will be at the front of the queue of operations for that logical unit 201. Due to a process called striping, a single file-level read may result in multiple fragment reads, each requiring a read operation be performed on a different logical unit. The striping pattern increases the proportion of logical units included in an average read request and hence the chance that at least one read operation on one logical unit becomes delayed behind a slow erase or program command. The overall file read request is not complete until all its fragments complete, and thus the overall file read request is as slow as the slowest logical unit that has fragments that are being read as part of the overall file read request.

In this way, the slow erase and program operations on even one logical unit out of many can still contribute as a major factor in high read latencies and reduced system speed. Suppose a hypothetical in which the average striping causes data of a single file to be scattered across 25 percent of the logical units in a data storage system. Now suppose that an erase operation is 50 times slower than a read operation. In this case, the presence of an erase operation on just one logical unit will cause an average slowdown of 6.25 times for read requests which happen during the erase operation. For instance, for a given read request, there is a 25% chance that one of the read operations will be on the logical unit that is presently performing the erase operation. In the 25 percent likelihood of that occurring, on average the erase operation will be halfway through, requiring 25 times the time of the read operation for the erase to complete. Thus, the overall system response to a read request is slowed down appropriate by 6.25 times (25 times if an erase operation is occurring multiplied by 25% chance of the erase operation occurring on a logical unit that needs to be read as part of the overall read operation). Note that the recognition by the inventor of this and other problems mentioned herein with the prior art does not constitute, in any way, an admission that the corresponding problem is generally recognized, nor recognized to those of ordinary skill in the art.

Figure 3:
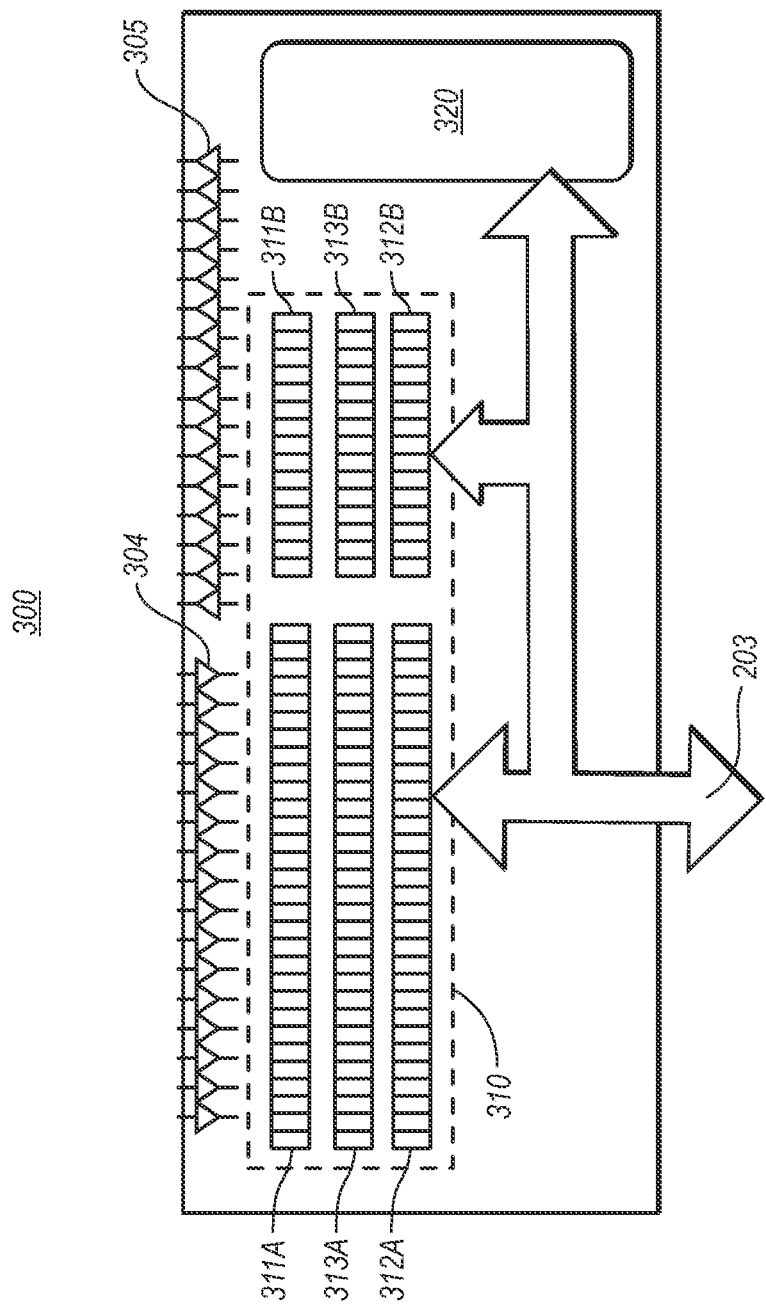
FIG. 3 illustrates a block diagram of an example control circuit of the NAND flash memory logical unit that is capable of interrupting an erase or program command.

In any case, the principles described herein provide a significantly improved control circuit for a NAND flash logical unit. FIG. 3 illustrates block diagram of a control circuit 300 that represents one embodiment of the improved control circuit. The control circuit 300 is an example of the control circuit 201 or the control circuit 202 of FIG. 2. The control circuit 300 includes registers 310 and command circuit 320. The registers 310 includes internal data register 311A, an internal address register 311B, an external data register 312A, an external address register 312B, a supplemental data register 313A, and a supplemental address register 313B. The control circuit also includes sense amplifier array 304 from which read information from the memory cells may be applied to the internal data register 311A, and write amplifier array 305 through which the program data is written. Hereinafter, the combination of registers 311A and 311B may be referred to as "register 311", the combination of registers 312A and 312B may be referred to as "register 312", and the combination of registers 313A and 313B may be referred to as "register 313".

The internal data register 311A is for receiving data for an active read command through the sense amplifier array 304, and for asserting data of an active program command through the write amplifier array 305. The internal address register 311B drives the appropriate circuitry to address the appropriate memory cells that are the target of the command. For instance, if there is a read command, the address in the address register 311B causes the values from the corresponding memory cells to drive the sense amplifier array 304 with the corresponding values, thereby causing the values to be stored in the internal data register 311A. Likewise, if there is a program command, the address in the internal address register 311B causes a connection between the write amplifier array 305 and the corresponding addressed memory cells. This causes the data in the internal data register 311A to be written to the address memory cells through the write amplifier array 305. If there is an erase command, corresponding circuitry addresses the memory segment addressed by the address in internal address register 311B, and causes the values of all of the memory cells in that segment to be reset.

The external data register 312A is for receiving data associated with a command from the communication bus interface 203, and for providing data resulting from an already executed command back to the external command source 204 through the communication bus interface 203. The external address register 312B is for receiving an address associated with the command from the communication bus interface 203.

The supplemental data register 313A and the supplemental address register 313B facilitate pausing and resuming of an active in-process command in a manner that will be described in further detail. Two specific embodiments will be described below. The behavior and function of the supplemental registers 313A and 313B differs depending on the embodiment.

First Embodiment

Dedicated Internal Registers

In the first embodiment of the operation of the control circuit 300 that will now be described, the supplemental data register 313A and the supplemental address register 313B may be an additional set of internal registers. This allows the internal data register 311A and the internal address register 311B to be reserved for use for non-read operations (e.g., program and erase operations). Meanwhile, the supplemental data register 313A and the supplemental address register 313B may be dedicated internal registers for read operations.

When a read command is loaded into the supplemental registers 313, the register 313 is given processing priority if the command logic 320 determines that the read command is to take priority. Thus, registers 311A and 311B are used for command that are potentially interruptible, and registers 313A and 313B are used for commands that might interrupt a command that is present in registers 311A and 311B. The register sizes of FIG. 3 are not drawn to scale. Typically, the data register will be as large as the size of memory that is able to be programmed and/or read in a single command, however large that is. This size has been referred to herein as a "page". The address register may be as large as needed to uniquely identify the portion of memory being programmed and/or read.

Figure 4:
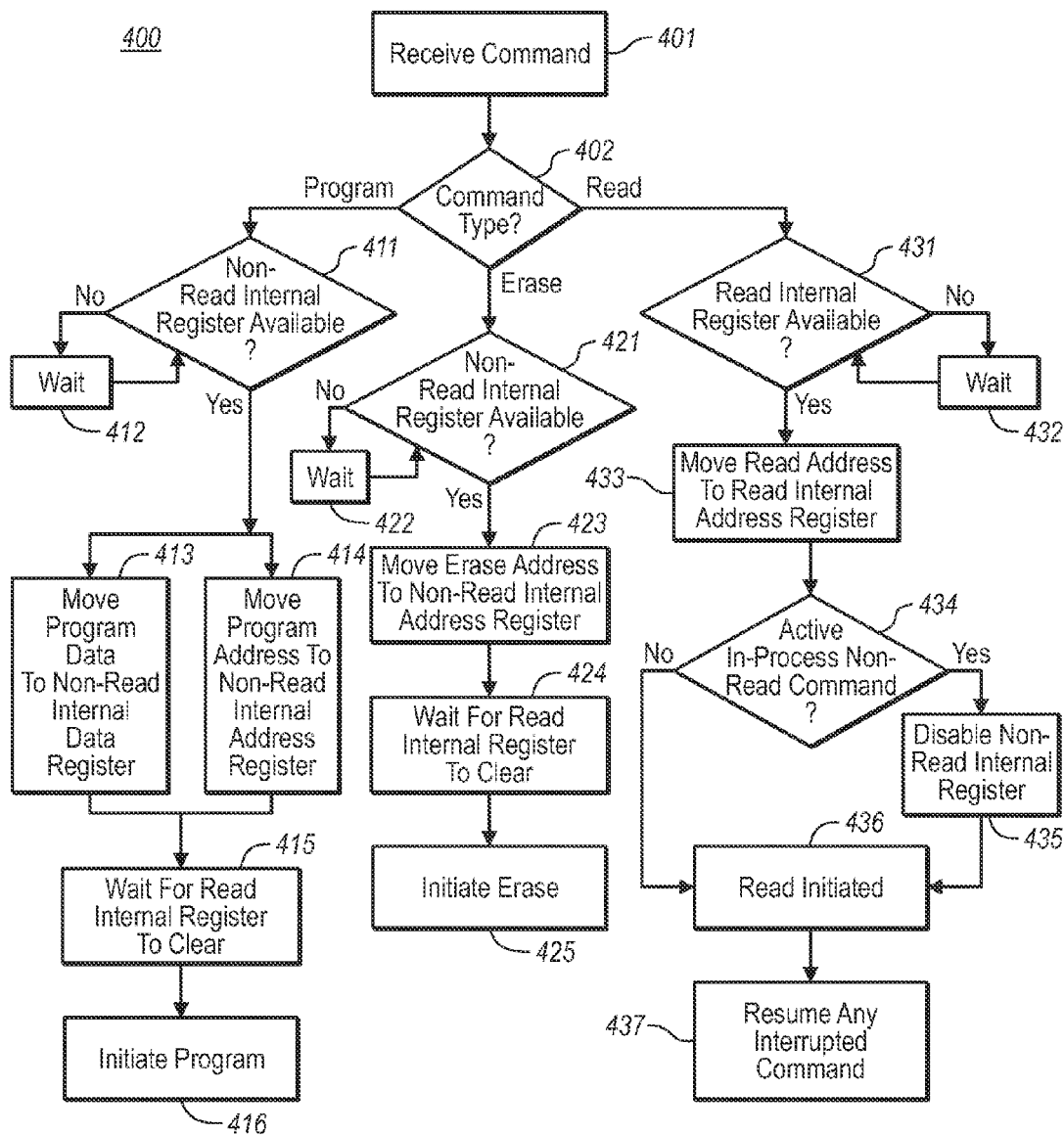
FIG. 4 illustrates a flowchart of a method for a control circuit of FIG. 3 to respond to a command in accordance with one embodiment described herein in which a supplemental register acts as a dedicated internal register for read commands.

FIG. 4 illustrates a flowchart of a method 400 for the control circuit of FIG. 3 to process commands when using the supplemental registers as dedicated registers. The method 400 is initiated upon receiving a command into the external register 312 (act 401). If this command is a program command, then the program data (i.e., the data that is to be written) is loaded into the external data register 312A, and the address corresponding to the memory cells that are to be programmed is loaded into the external address register 312B. If the command is an erase command, this means that the erase address corresponding to the memory cells that are to be erased is loaded into the external address register 312B. If the command is a read command, this means that the read address corresponding to the memory cells that are to be read is loaded into the external address register 312B.

The command circuit 320 detects the type of command (decision block 402) associated with the command just loaded into the external register 312. For instance, the command type might be a program command type ("Program" in decision block 402), an erase command type ("Erase" in decision block 402), or a read command type ("Read" in decision block 402).

If the type of command is a program command type ("Program" in decision block 402), the command circuit 320 then determines whether the dedicated non-read internal register 311 is available (decision block 411). If the dedicated non-read internal register 311 is not yet available (No in decision block 411), then the command circuit waits (act 412) until it is available (Yes in decision block 411). If the dedicated non-read internal register 311 is available (Yes in decision block 411), the program data is moved from the external data register 312A to the dedicated non-read internal data register 311A (act 413), and the program address is moved from the external address register 312B to the dedicated non-read internal address register (act 414). Then, the program operation awaits the clearing of the read internal register 313 (act 415). Once there are no read operations to be performed, then the program operation initiates (act 416). If there are no read operations in the read internal register 313, then the program operation may initiate immediately.

If the type of command is an erase command type ("Erase" in decision block 402), the command circuit 320 also determines whether the dedicated non-read internal register 311 is available (decision block 421). If the dedicated non-read register 311 is not yet available (No in decision block 421), then the command circuit waits (act 422) until it is available (Yes in decision block 421). If the dedicated non-read internal register 311 is available (Yes in decision block 421), the erase address is moved from the external address register 312B to the dedicated non-read internal address register (act 423) once available. Then, the program operation awaits the clearing of the read internal register 313 (act 424). Once there are no read operations to be performed, then the erase operation initiates (act 425). If there are no read operations in the read internal register 313, then the erase operation may initiate immediately.

If the type of command is a read command type ("Read" in decision block 402), the command circuit determines if the dedicated read internal register 313 is available (decision block 431). If the register 313 is not available (No in decision block 431), then the command circuit waits (act 432) until it is available (Yes in decision block 431). If the dedicated read internal register 313 is available (Yes in decision block 431), the read address is moved from the external address register 312B to the dedicated read internal address register 313B (act 433). If there is an active in-process non-read command (Yes in decision block 434), the non-read internal data register 311A and the non-read internal address register 311B are disabled (act 435) such that the program or erase operation pauses. This disabling is subject to a determination by the command circuit that interruption of the in-process non-read command is appropriate. If the command circuit proceeds with interrupting the in-process non-read command, the read operation is commenced (act 436). This might be accomplished by enabling the read internal registers 313 such that the contents of the addressed memory cells are read into the dedicated read internal data register 313A. After completion of the read operation (after act 436), the interrupted command is resumed (act 437). For instance, the read internal register 313 might be disabled, while the non-read internal register 311 might be enabled such that the program or erase command resumes.

In one embodiment, rather than automatically disabling the non-read command (act 435), the command circuit might await an appropriate time to interrupt the non-read command. This might be during a time when it is easier to capture the state of the non-read command. For instance, if the program or erase command occurs using a sequence of verify phases, where the progress of the program or erase command is checked by briefly switching over to measure the cell contents, the interruption may await the next verify phase, and then perform the interruption during, immediately before, and/or immediately after the verify phase. If the program or erase operation operates on a timer, the command circuit might pause the timer when the non-read operation is interrupted, and restart the timer when the non-read operation resumes. These points provide special advantage in the ease of saving state of the paused operation and in requiring a minimum of new circuitry or logic to assist the safe resumption of the interrupted operation.

Second Embodiment

Backup Registers

In the second embodiment of the operation of the control circuit 300, the supplemental internal data register 313A is a backup data register, and the supplemental internal address register 313B is a backup address register. In that case, the internal register 311 is used for all types of commands including read commands, program commands, and erase commands. In that case, the command circuit 320 is structured to backup data and address state of an in-process program or erase command from the internal register 311 to the backup register 313, when the command circuit 320 determines that a read command is to interrupt the in-process non-read command. The data and address for the interrupting read command are then provided into the internal register 311 to thereby perform the read command. After the interrupting read command is completed, the data and address of the interrupted non-read command are then restored into the internal register 311 from the backup register 313 for further processing of the program or erase command. It may be that the program or erase command completes without further interruption, but perhaps the program or erase command is interrupted multiple times before the program or erase command is complete.

Figure 5:
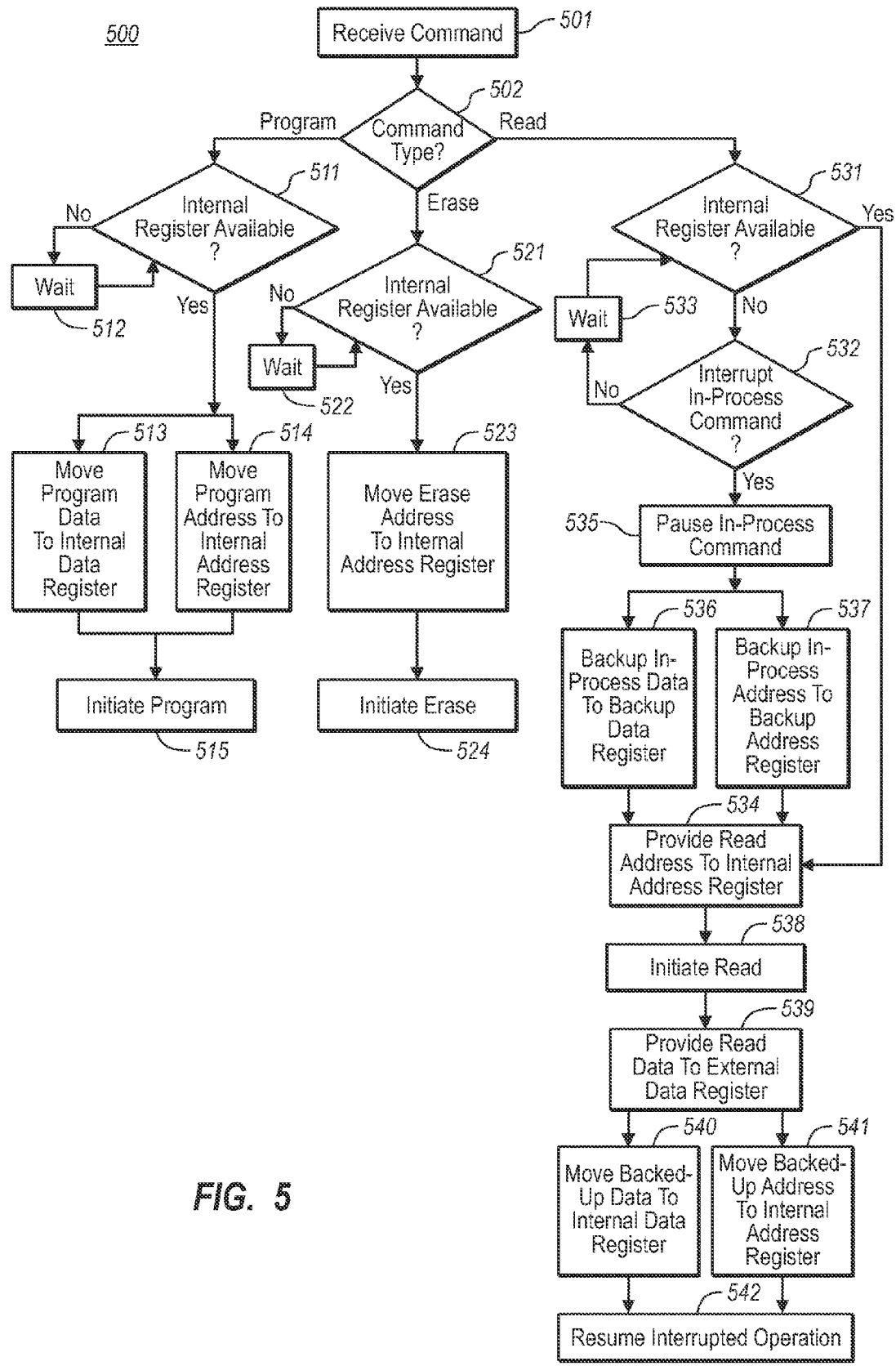
FIG. 5 illustrates a flowchart of a method for a control circuit of FIG. 3 to respond to a command in accordance with another embodiment described herein in which a supplemental register acts as a backup register for interrupted in-process commands.

FIG. 5 illustrates a flowchart of a method 500 for the control circuit to process commands when using the supplemental registers 313 as backup registers. The method 500 may be initiated each time a command is received by the control circuit 300 into the external register 312 (act 501). This act may be similar to that described for act 401 of FIG. 4. The command circuit 320 then determines the type of the command (decision block 502), which determination might be done in the same manner as performed for decision block 402 of FIG. 4.

Program and erase command response in the second embodiment is similar to the first embodiment of FIG. 4. That is, if a program command is received into external register 312 ("Program" in decision block 502), then the command circuit 320 determines whether the internal register 311 is available (decision block 511). If the internal register 311 is not yet available (No in decision block 511), then the command circuit waits (act 512) until it is available (Yes in decision block 511). If the internal register 311 is available (Yes in decision block 511), the program data is moved from the external data register 312A to the internal data register 311A (act 513), and the program address is moved from the external address register 312B to the internal address register 311B (act 514). The program operation is then initiated (act 515).

If the type of command is an erase command type ("Erase" in decision block 502), the command circuit 320 also determines whether the internal register 311 is available (decision block 521). If the internal register 311 is not yet available (No in decision block 521), then the command circuit waits (act 522) until it is available (Yes in decision block 521). Once available, the erase address is provided from the external address register 312B to the internal address register 311B (act 523). Then, the erase operation is initiated (act 524).

If the type of command is a read command type ("Read" in decision block 502), the command circuit also determines if the internal register 311 is available (decision block 531). If the internal register 311 is not available (No in decision block 531), then the command circuit determines if the in-process command in the internal register 311 is to be interrupted (decision block 532). There might be a wide variety of information to consider when determining whether to make this interruption. However, several examples cases will be described. If the program or erase operation has a verify phase, then perhaps the read operation interrupts the program or erase operation during, before or after the next verify phase. Perhaps an additional criteria might be whether that verify phase validates that a sufficient majority of the program or erase operation is already complete (e.g., 98% of the memory cells have been verified as accurately programmed or erase) such that the remainder of the program or erase operation is not expected to take a significant time. In that case, perhaps the command circuit might forego the interruption and just allow the program or erase operation to complete, even though there is a read operation waiting for the completion. Alternatively, perhaps the program and erase operation is on a timer, and the timer indicates that there is not significant time remaining in an in-process program or erase operation to warrant an interruption.

If the in-process command is not to be interrupted presently (No in decision block 532), the command circuit waits (act 533). If the internal register 311 becomes available (Yes in decision block 531) while waiting, then the read address is provided to the internal register 311 (act 534). If the command circuit decides at any point when the in-process command is still being processed, that the in-process command is to be interrupted (Yes in decision block 532), then the command circuit pauses the in-process command (act 535). If the in-process command is processed on a timer, then the timer may be paused at this stage. The data and address information for the in-process command is then backed up to the supplemental data register 313A (act 536) and to the supplemental address register 313B (act 537). In the case of an interrupted erase operation, there would not necessarily be data to be backed up, but there would be data to be backed up in the case of an interrupted program operation. At that stage, the read address may be provided from the external address register 312A to the internal address register 311A (act 534). The read command is then initiated (act 538).

After the read operation is completed, or in other words, after the contents of the memory cells addressed by the read address in internal address register 311B are read into the internal data register 311A, the read data is moved from the internal data register 311A to the external data register 312A (act 539). At this point, the data associated with the read operation may be read on the communication bus 203. In the meantime, the interrupted in-process operation is then resumed (assuming that there are no further read operations that are to take priority of the interrupted command), by moving the data from the backup data register 313A to the internal data register 311A (act 540), and moving the address from the backup address register 313B to the internal address register 311B (act 541). At this point, the interrupted operation may be resumed (act 542).

Prior to resuming the in-process command, and once the read operation was completed, there might be one or more other read operations that need to be performed prior to resuming the interrupted operation. If that is the case, for each read operation, acts 534, 538 and 539 would be performed in sequence by providing the read address from the external address register 312B to the internal address register (act 534), initiating the read operation (act 538), and once complete, providing the read data from the internal data register 311A to the external data register 312A (act 539). A single in-process non-read command may be interrupted one or any number of times prior to completion, and any given interruption might result in one or more read operations occurring before the non-read command is resumed.

Figure 6:
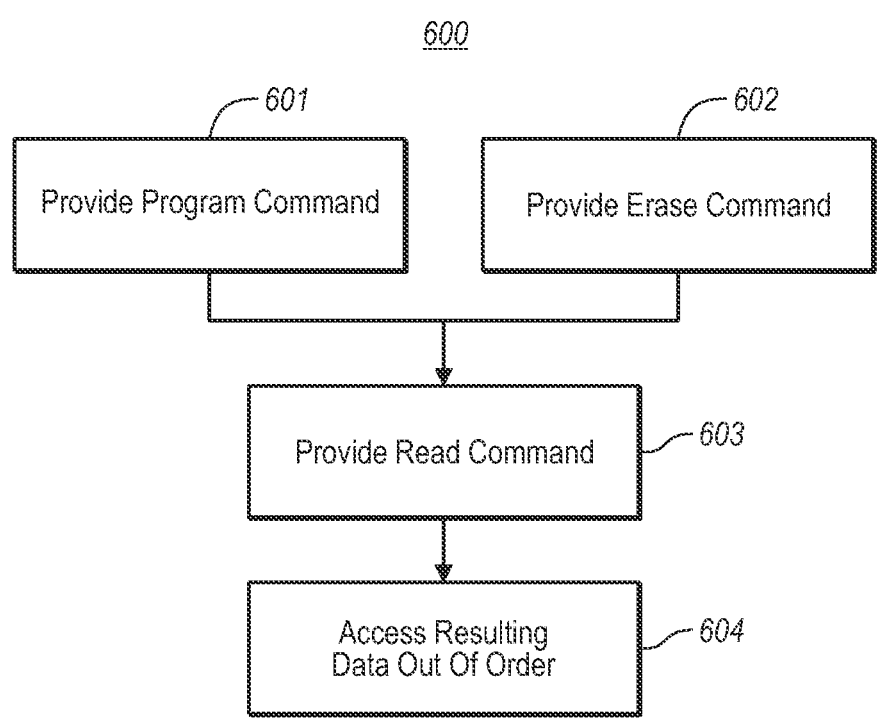
FIG. 6 illustrates a flowchart of a method for an external command source to communicate with the control circuit of FIG. 3.

Referring to FIG. 2, an external command source 204 provides commands to the NAND flash memory module 200 through the communication bus interface 203. FIG. 6 illustrates a flowchart of a method 600 for operating an external command source that provides commands to a NAND flash memory logical unit that is controlled through a control circuit. For instance, the external command source might be the external command source 204 of FIG. 2. The NAND flash memory logical unit might be, for example, the logical unit 201 or the logical unit 202 of FIG. 2.

The external command source provides at least one program command (act 601) and at least one erase command (act 602) to the control circuit. For instance, the control circuit might be the control circuit 211 if communicating with the NAND flash memory logical unit 201, or the control circuit 221 if communicating with the NAND flash memory logical unit 202. In either case, the external command source 204 may communicate the commands to the respective control circuit over the communication bus 203.

After a program and erase operation are provided to the NAND flash memory logical unit, a subsequent read operation is provided to the control circuit (act 603). This read operation may interrupt a previous program or erase operation in process at the NAND flash memory logical unit, whether that operation is the program operation or the erase operation. In either case, the control circuit may interrupt the program command or the erase command using a supplemental register. For instance, the supplemental register may serve as a dedicated read internal register in the case of the first embodiment described above, or the supplemental register may serve as a backup register in the case of the second embodiment described above. After the read operation interrupts the interrupted operation, the read data is provided back to the external command source 204 (act 604). Note that the data is read out of order in the execution of the interrupted command. For instance, the command source 204 may issue a program command, and then a read command, both to the same logical unit. However, the data may be read by the command source 204 before the program command is even complete on the logical unit. Similarly, the command source 204 may issue an erase command, and then a read command, both to the same logical unit. However, the data may be read by the command source 204 before the erase command is even complete on the logical unit.

A specific implementation of an interrupted erase and interrupted program operation will now be described with respect to the ONFI specification. Let us begin with erasure. In NAND flash memory, erasure is the removal of electrons that might be stored on a floating gate which is a section of conductor (usually polycrystalline silicon but sometimes other materials), surrounded entirely by insulator, and positioned to modulate the flow of current in a nearby semiconductor channel as described with respect to FIG. 1. This is typically accomplished by arranging for an electric field large enough to attract electrons to quantum-tunnel across the insulator out of the floating gates. The tunneling process is relatively slow because a field intense enough to do this job quickly will also be intense enough to provoke permanent failure in the insulation. Tunneling speed is governed by exponential equations which make it quite sensitive to variations in insulator thickness, which are inevitably present due to process variations over the billions of cells on a chip. In practice a field intense enough to drain the gate of electrons over a time of 2 to 5 milliseconds across the thickest insulation of any cell is also weak enough not to cause damage in even the thinnest insulation of any cell.

An example of an erase operation using the principles described herein will now be described. This erase operation is just one of many different implementations that are enabled by the broader principles described herein. That being the case, any specific features described for this erase operation should not be construed as imposing any restriction whatsoever on the broader embodiments described herein.

In this specific example, erasure occurs in blocks. Recall that a block is a collection of multiple pages, and a page is a collection of multiple memory cells. The end result of an erase operation is known. Specifically, all memory cells within the block being erased should be empty of charge to within acceptable tolerance. No data values are required for comparison in any verification phase. Thus, if the erase operation uses verification, the content of the block's memory cells is compared against the known desired outcome. However, an erase operation might not have a verification phase since verification takes more time and complexity, and it is just simpler to have the erase operation be timed. An erase time is chosen that is statistically long enough to ensure within acceptable probability that all memory cells in the block will be empty. Most cells will be empty long before the erase time expires, but there is no harm to continued application of the erase operation on an already empty cell. Accordingly, eventually, even the memory cell that erases slowest will be empty.

The erase procedure, in this specific example, may take milliseconds to complete. However, the erase process uses a process called quantum tunneling, in which each electron is removed from the floating gate in a matter of picoseconds once the tunneling starts. That said, the tunneling starts at a different time for each electron. Thus, at almost any given moment, each electron to be moved has either already tunneled, or has not started to tunnel yet. Therefore, the erase process can be interrupted and resumed without significant loss of efficiency. So long as the total time spent in the erase process meets the total duration of the target erase time, the required probability of complete erasure is assured.

During the erase process, there are some costs in the system which are longer than pico-second scale if the erase process is interrupted and resumed. For instance, a special voltage source may need to be released (when the erase operation is interrupted) and recharged (when the erase operation resumes). Furthermore, there may be time associated with preserving and reasserting the proper erase state (as in acts 435 and 437 for FIG. 4, and acts 535, 536, 537, 540, 541, and 542 of FIG. 5). Still, these time costs are a tiny fraction of the total erase process time. The time costs are short enough to avoid significant interfering delays for read operations, but long enough to ensure the erase operation is not significantly lengthened by the overheads of interruptions and resumptions. These time costs may be taken into consideration when the control circuit 320 determines whether to interrupt the erase operation, or whether to let the erase operation complete or proceed to a subsequent stage.

When interrupting an erase operation, the internal state of the control circuit should be able to see the status of both the erase and read operations, when the erase operation has been interrupted by the read operations. Although the principles of the present invention are not limited to the use of the ONFI protocol on the communication bus, an example of how this status reporting might be achieved will now be described with respect to compatibility with pins, signals, commands, and status registers provided by the ONFI standard.

In ONFI-compatible chips, status is recorded using bit (6) of the status register SR. This bit will be referred to as "SR(6)". The ONFI protocol assumes that the status SR(6) will be polled. There are output pins which reflect the state of SR(6) but if the chip contains multiple logical units, then this polling method cannot be relied upon, since SR(6) indicates busy if any one of the logical units is busy.

The following process, which may be implemented (for example) by way of a state machine, explains how this can be done compatibly with the ONFI specification. That said, one of ordinary skill in the art, after having read this description, will realize that the process of interrupting an erasure operation by a read operation could be managed by different signaling conventions, especially if the chip had a different connection and command standard than ONFI.

First, once the erase operation has been commanded and accepted by the NAND flash memory module, the logical unit containing the block to be erased asserts "Not Ready". A read operation may now be commanded any time after the SR(6)

bit for the logical unit is observed to be "Not Ready". If the read address is for a location within the block to be erased, then the chip's behavior may well be undefined, but most probably will reject the read command with an error indication. This may be one reason why the command circuit 320 might choose not to interrupt the erase operation with the read operation (refer to No in decision block 532). A similar decision may be made between Yes in decision block 434 and act 435 of FIG. 4. For instance, if the read command in the read internal register is for an address within the block being erased in the erase command in the non-read internal register, then the read operation may fail. If the read operation is accepted by the control circuitry of the logical unit, then the block address for the register for the erase operation remains undisturbed, and the read operation is enqueued.

The logical unit remains not ready. In this example process, the erase operation is periodically paused, at some interval shorter than or comparable to typical read latencies for the logical unit. The status remains Not Ready. During any one of such a pause, the read operation may now proceed using its own read address. The cell values are then determined by the sense amplifiers with the result values placed into the internal data register, and then moved to the external data register. At this point, the SR(6) bit becomes "Ready" when the read option is completed and the data is ready for read-out onto the communication bus. ONFI interleaved Reading (Read Cache) may optionally be used to start another Read.

The Read data is collected over the external data bus. If an interleaved Read Cache is pending, then SR(6) becomes Not Ready when the current page has been collected, and will become Ready when the interleaved (pending) Read Cache is complete. If an interleaved Read is pending, then the SR(6) asserts Ready on the next completion of the next read operation.

If there was no interleaved Read pending, all Read data has been collected. If the erase operation has not completed, then SR(6) becomes "Not Ready" and the erase is resumed, whereupon the erase pauses periodically as mentioned above in case another read operation is to interrupt.

If the erase operation has finished, SR(6) remains "Ready" and the logical unit is idle, awaiting any command.

Now a very specific example of program will be described using the ONFI specification. After erasure of a block, data is programmed page-by-page. On NAND flash, the programming operation is achieved by tunneling (the same principle as for the erase operation) but the electrons flow in the opposite direction so as to accumulate on the floating gate. This process has variable timing but typically takes hundreds of microseconds to complete.

To program, a bias voltage is applied to the control gate for a sufficient time to get the correct number of electrons written into the floating gate of each memory cell. In order for this to be done accurately, the NAND flash memory logical unit may pause and verify the state of each cell in the page. This is done by sensing the electrons in the floating gates to compare against the intended pattern. The process is called "verification" and is generally supervised by the command circuit 320 within each logical unit. This allows the charge to be accurately controlled and the process to finish when the last cell reaches its desired state, which is generally much shorter than the worst-case timing that is used to decide the duration of the Erasure process.

Verification may not be used in some designs. In others, especially multi-level cell designs, it will occur several times. The target data value does not decide the bias applied to a cell, instead it changes how long that bias is applied. After each verification, the bias is applied only to cells which still have not reached their intended state (cells needing more electrons on the floating gate). Thus, the Program process is in general a loop of applying bias to the subset of cells needing more electrons, and then a verification against the reference values held in the program data page register. This process allows programming both to complete as soon as possible despite statistical variation and for multiple states between empty and full to be achieved accurately. Thus, a memory cell might be programmed to contain multiple bits of information.

The program process can be approximately an order of magnitude slower than a typical read latency. If a program operation is in progress and a read operation is desired from the same logical unit, the resulting delay of the read operation is much larger than the delay when programming is not in process. In order to reduce latency caused by the in-process program operation, one or more read commands may interrupt a program operation. Just as with the erase operation, the charge transfer is a quantum tunneling event which happens on a pico-second scale and may be paused with insignificant change to efficiency. When the external control decides that there are no more read commands waiting, or if the external control decides that the program operation has a higher priority, the program operation continues. This eliminates most of the latency caused by program operations slowing down read operations. These shorter read latencies are usually more valuable than the cost of delaying the programs. In effect, the valuable read operations are given priority to interrupt the less urgent program operations.

In this specific example, the read operation might interrupt an in-process program operation just before, or just after a verification phase of the program operation. The command circuit 320 might accomplish this with the pins, signals, commands, and status registers provided by the ONFI standard using a process now about to be described. A person of ordinary skilled in the art, after having read this description, will understand that the process could be managed by different signaling conventions, especially if the chip had a different connection and command standard than ONFI. In this example, the register for program data is distinct from the register used to hold read data, and thus uses the first disclosed embodiment above in which the supplemental register acts as a second internal register. Thus, the address for programming is latched separately from the address used for reading.

The program operation may begin at any time permitted by the design of the logical unit. During the program operation, the SR(6) status bit indicates "Not Ready". The program operation is periodically paused, at some short interval comparable to typical page read latencies for the device (for example, at 10 microsecond intervals). This pause may be purely to enable read operations to interrupt or it may be a prelude to transition to Verification. The status SR(6) remains "Not Ready".

Any pending read operation may now proceed using its own read address, and cell values are determined by the sense amplifiers with the result values placed into the page register for Reading. SR(6) for the LUN becomes "Ready" when the array Read is complete and data is Ready for Read-out from the read page register.

ONFI interleaved reading (Read Cache) may optionally be used to start another read operation. The read data is collected over the external data bus. If an interleaved Read Cache is pending, then SR(6) becomes "Not Ready" when the current page has be collected, and will become "Ready" when the interleaved (pending) Read Cache is complete. If an interleaved read operation is pending, the read operation is performed and await SR(6) is "Ready" indicating that the next read operation has been completed.

When the final read operation's data is read, and no interleaved read is pending, the chip resumes the interrupted program operation. The status SR(6) of "Not Ready" is asserted again. If the pause was purely to allow the reading operation, then program operation resumes in the data array. If the pause was a prelude to verification, a verification phase of the program operation now begins. Verification may lead to resumption of writing if not all bits are at their desired state. This process loops until verification verifies proper completion of all of the memory cells to the desired value. At this stage, the LUN is idle, and awaits any command.

This state sequence applies if the read operation is allowed to intervene prior to a verification phase, but the ordering of steps may be changed to allow read operations to intervene after verification, or indeed that read operations might usefully intervene both before and after the verification phase since the verification phase itself is a step similar in duration to a read operation. Whenever a read operation intervenes, it is important to save the state for the program-verify cycle allowing that state to be undisturbed by the interrupting read operations. This allows the program-verify cycle to resume at that state when the intervening read operations are completed.

The program-verify loop may be slightly longer than the read latency in some situations, but one implication is that it could be valuable to make the loop stop more frequently. This will decrease the average read latency, since the read operation may have more frequent opportunities to interrupt, and will also permit more accurate programming due to more frequent verification and finer granularity of the charge changes expected in each program-verify cycle. Such a tradeoff is not so attractive if the program-verify cycle cannot be interrupted, because additional verification will add to the program time. Making programs interruptible allows a chip designer to deliver a different balance of reliability and accurate signals while still meeting overall system performance goals in a way not possible without interruptible programming. Paradoxically, slower but interruptible program operations may result in faster, more reliable systems, with better device endurance and more voltage levels per cell.

This tradeoff may be especially valuable for enabling multi-level charge chips with two, three, or more bits per cell to be accepted as high performance chips. Today, the throughput of flash chips in storing new data greatly exceeds the average rate required for many applications. However, so long as program operations interfere with read operations, and those same applications typically require low latencies, there is a demand to make erase and program operations faster. By making the erase and operations interruptible, there are better system level tradeoffs which can free the device designer to consider trading higher density of bits per cell and improved device endurance through multiple cycles and years, without loss of overall system performance.

As an additional advantage, since the program and erase cycles can be made interruptible, the program and erase voltages may be reduced. This has the effect of increasing the time required for program and erase operations, but also improves the lifetime of the chip since high voltage differentials tend to wear on device components over time. However, the increased time required for program and erase operations may be acceptable considering that they are interruptible. Thus, chip life may be improved.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A physical NAND flash memory logical unit comprising:
   a plurality of memory cells that are programmable and erasable;
   a control circuit configured to respond to a plurality of commands including at least read commands, program commands, and erase commands that are targeted at the plurality of memory cells;
   a communication bus interface communicatively coupled to the control circuit for providing read, program, and erase commands to the control circuit from an external command source; and
   wherein the control circuit comprises:
      a plurality of registers comprising an internal data register, an internal address register, an external data register, an external address register, a supplemental data register, and a supplemental address register;
      a command circuit for responding to the plurality of commands by controlling the plurality of registers;
      wherein the supplemental data register and supplemental address register are used to enable in-progress erase and program commands to be suspended in order to process a later read command and to resume a suspended erase or program command;
      wherein the internal data register is a first internal data register, and the internal address register is a first internal address register, wherein the first internal data register and the first internal address register are dedicated to non-read commands; and
      wherein the supplemental data register is a second internal data register, and the supplemental address register is a second internal address register, wherein the second internal data register and the second internal address register are dedicated to read commands.

2. The physical NAND flash logical unit in accordance with claim 1,
   wherein the non-read commands include program commands and erase commands.

3. The physical NAND flash logical unit in accordance with claim 2,
   wherein the second internal data register and the second internal address register have processing priority at least under some circumstances over the first internal data register and the first internal address register when performing commands on the plurality of memory cells.

4. The physical NAND flash logical unit in accordance with claim 3,
   wherein the command circuit is configured to detect a type of command associated with the address in the external address register,
   and if the type of command is a program command type, is configured to move data from the external data register to the first internal data register once available and move the address in the external address register to the first internal address register once available,
   and if the type of command is an erase command type, is configured to move the address in the external address register to the first internal address register once available,
   and if the type of command is a read command type, is configured to move the address in the external address register to the second internal address register.

5. The NAND flash logical unit in accordance with claim 1, wherein the command circuit determines that a read command is to interrupt an in-process program command in manner that the read command interrupts the in-process program command during a verify phase of the program operation corresponding to the in-process program command.

6. The NAND flash logical unit in accordance with claim 1, wherein the command circuit determines that a read command is to interrupt an in-process program command in manner that the read command interrupts the in-process program command before a verify phase of the program operation corresponding to the in-process program command.

7. The NAND flash logical unit in accordance with claim 1, wherein the command circuit determines that a read command is to interrupt an in-process program command in manner that the read command interrupts the in-process program command after a verify phase of the program operation corresponding to the in-process program command.

8. The NAND flash logical unit in accordance with claim 1, wherein the command circuit determines that a read command is to interrupt an in-process program command if there is more than a defined amount of time remaining in the program operation corresponding to the in-process program command.

9. The NAND flash logical unit in accordance with claim 1, wherein the command circuit determines that a read command is to interrupt an in-process program command if a most recently conducted verify phase has determined that less than a defined amount of memory cells have completed programming corresponding to the in-process program command.

10. The physical NAND flash logical unit in accordance with claim 1,
wherein the supplemental data register is a backup data register, and the supplemental address register is a backup address register,
wherein the command circuit is structured to:
a) backup data and address state of an in-process program command from the internal data register and internal address register to the backup data register and the backup address register when the command circuit determines that a read command is to interrupt the in-process program command;
b) provide the address for the interrupting read command into the internal address register for performing the read designated by the interrupting read command on the plurality of memory cells; and
c) at some point after the interrupting read command is completed, restore the data and address for the in-process program command into the internal data register and the internal address register for further processing of the program command.

11. The physical NAND flash logical unit in accordance with claim 10, wherein the read command is a first read command, wherein the command circuit is further structured to:
d) backup state of an in-process erase command to at least the backup address register when the command circuit determines that a second read command is to interrupt the in-process erase command;
e) provide the address for the interrupting second read command into the internal address register for performing the read designated by the interrupting second read command on the plurality of memory cells; and
f) at some point after the interrupting second read command is completed, restore the state of the in-process erase command into at least the internal address register for further processing of the erase command.

12. The physical NAND flash logical unit in accordance with claim 1,
wherein the supplemental data register is a backup data register, and the supplemental address register is a backup address register,
wherein the command circuit is structured to:
a) backup state of an in-process erase command to at least the backup address register when the command circuit determines that a read command is to interrupt the in-process erase command; and
b) provide the address for the interrupting read command into the internal address register for performing the read designated by the interrupting read command on the plurality of memory cells; and
c) at some point after the interrupting read command is completed, restore the state of the in-process erase command into at least the internal address register for further processing of the erase command.

13. The physical NAND flash logical unit in accordance with claim 12, wherein the erase operation corresponding to the in-process erase command is performed using a timer, wherein the command circuit is configured to pause the timer when the state of the in-process erase command is backed-up to the backup address register, and restart the timer in conjunction with the state of the in-process erase command being restored to the internal address register for further processing of the erase command.

14. The NAND flash logical unit in accordance with claim 12, wherein the erase operation corresponding to the in-process erase command is performed using one or more verify phases, wherein the command circuit determines that a read command is to interrupt the in-process erase command in manner that the read command interrupts the in-process erase command only before, during, or after a verify phase of the erase operation.

15. The NAND flash logical unit in accordance with claim 12, wherein the command circuit determines that a read command is to interrupt the in-process erase command if there is more than a defined amount of time remaining in the erase operation corresponding to the in-process erase command.

16. The physical NAND flash logical unit in accordance with claim 1, wherein each of the plurality of memory cells is a multiple bit memory cell.

17. The physical NAND flash logical unit in accordance with claim 1, wherein the plurality of commands includes exclusively commands compatible with an ONFI protocol.

18. The physical NAND flash logical unit in accordance with claim 1, wherein the plurality of commands includes exclusively commands compatible with ONFI protocol version 1.0, 2.0 or 2.1.

19. A method for operating a control circuit of a physical NAND flash logical unit, the method comprising:
an act of receiving a program command by having data associated with the program command placed in an external data register and having an address associated with the program command placed in an external address register;
an act of determining readiness that an internal data register and an internal address register are ready to receive the program command;
in response to the act of determining readiness, an act of providing the program command into the internal data register and the internal address register by providing the data associated with the program command into an internal data register, and providing the address associated with the program command into an internal address register;

after the act of providing the program command into the internal data register and the internal address register, an act of initiating processing of the program command on a portion of a plurality of memory cells that are addressed by the address associated with the program command;

while still processing the program command, an act of determining that a read command received into the external address register is to interrupt processing of the program command;

an act of using a supplemental data register and a supplemental address register to enable simultaneously storing corresponding data and corresponding address of the program command and the read command and to interrupt processing of the program command;

an act of processing the read command on the plurality of memory cells; and after processing the read command, an act of resuming processing of the program command at least in part by using the supplemental data and address registers for processing one of the read command or the program command.

20. The method in according to claim 19, wherein the act of using the supplemental data register and the supplemental address register to interrupt processing of the program command comprises:

an act of backing up the data associated with the program command from the internal data register to the supplemental data register;

an act of backing up the address associated with the program command from the internal address register to the supplemental address register;

subsequent to the acts of backing up, an act of providing the address associated with the read command from the external address register to the internal address register;

wherein the act of processing the read command comprises:

an act of reading contents of a portion of the plurality of memory cells that are addressed by the address associated with the read command into the internal data register; and an act of providing the read data from the internal data register to the external data register; and wherein the act of resuming processing of the program command comprises:

an act of providing the data associated with the program command from the supplemental data register to the internal data register; and an act of providing the address associated with the program command from the supplemental address register to the internal address register.

21. The method in according to claim 19, wherein the act of using the supplemental data register and the supplemental address register to interrupt processing of the program command comprises:

an act of providing an address associated with the read command from the external address register to the supplemental address register; and an act of disabling the internal data register and the internal address register such that the program operation pauses;

wherein the act of processing the read command comprises:

an act of enabling the supplemental data register and the supplemental address register such that the contents of a portion of the plurality of memory cells that are addressed by the address associated with the read command are read into the supplemental data register; and an act of providing the read data from the supplemental data register to the external data register; and wherein the act of resuming processing of the program command comprises:

an act of disabling the supplemental data register and the supplemental address register;

an act of enabling the internal data register and the internal address register such that the program command resumes.

22. A physical NAND flash memory logical unit comprising:

a plurality of memory cells;

a control circuit configured to respond to a plurality of commands that are targeted at the plurality of memory cells;

a communication bus interface communicatively coupled to the control circuit for providing the plurality of commands to the control circuit, wherein the control circuit comprises:

a plurality of registers comprising:

a) an internal data register for receiving read data for an active read command or for asserting data of an active program command;

b) an internal address register for actively addressing a subset of the plurality of memory cells in fulfillment of an active read, program or erase command;

c) an external data register for receiving data associated with a command from the communication bus interface;

d) an external address register for receiving an address associated with a command from the communication bus interface;

e) a supplemental data register to facilitate pausing of an active command; and f) a supplemental address register to facilitate pausing of an active command;

wherein the internal data and address registers and the supplemental data and address registers are used simultaneously to contain data corresponding to both an interrupted command and an interrupting command;

wherein the internal data register is a first internal data register, and the internal address register is a first internal address register, wherein the first internal data register and the first internal address register are dedicated to non-read commands;

wherein the supplemental data register is a second internal data register, and the supplemental address register is a second internal address register, wherein the second internal data register and the second internal address register are dedicated to read commands, wherein the second internal data register is for receiving read data for an active read command, but not for asserting data of an active program command; and wherein the second internal address register is for actively addressing a subset of the plurality of memory cells in fulfillment of an active read command, but not for active program or erase commands; and a command circuit for responding to commands by controlling the plurality of registers.

23. The physical NAND flash logical unit in accordance with claim 22,
  wherein the supplemental data register is a backup data register, and the supplemental address register is a backup address register,
  wherein the command circuit is structured to:
   a) backup data and address state of an in-process program command from the internal data register and internal address register to the backup data register and the backup address register when the command circuit determines that a read command is to interrupt the in-process program command;
   b) provide the address for the interrupting read command into the internal address register for performing the read designated by the interrupting read command on the plurality of memory cells; and
   c) at some point after the interrupting read command is completed, restore the data and address for the in-process program command into the internal data register and the internal address register for further processing of the program command.

\* \* \* \* \*